(12) United States Patent
Julien et al.

(10) Patent No.: US 11,640,921 B2
(45) Date of Patent: May 2, 2023

(54) PROCESS FOR FABRICATING AN INTEGRATED CIRCUIT COMPRISING A PHASE OF FORMING TRENCHES IN A SUBSTRATE AND CORRESPONDING INTEGRATED CIRCUIT

(71) Applicant: STMicroelectronics (Rousset) SAS, Rousset (FR)

(72) Inventors: Franck Julien, La Penne sur Huveaune (FR); Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 143 days.

(21) Appl. No.: 17/068,112

(22) Filed: Oct. 12, 2020

(65) Prior Publication Data

US 2021/0118725 A1 Apr. 22, 2021

(30) Foreign Application Priority Data

Oct. 16, 2019 (FR) ...................................... 1911549

(51) Int. Cl.
  *H01L 21/762* (2006.01)
  *H01L 21/02* (2006.01)
  (Continued)

(52) U.S. Cl.
  CPC .... *H01L 21/76224* (2013.01); *H01L 21/0217* (2013.01); *H01L 21/308* (2013.01);
  (Continued)

(58) Field of Classification Search
  CPC ........... H01L 21/76224; H01L 21/0217; H01L 21/30625; H01L 21/308; H01L 21/31116;
  (Continued)

(56) References Cited

U.S. PATENT DOCUMENTS 6,406,962 B1 * 6/2002 Agnello ............ H01L 29/78642
                                                     438/270
2007/0066030 A1   3/2007 Kim
(Continued)

FOREIGN PATENT DOCUMENTS

CN    103579074 A    2/2014
KR    100645188 B1   11/2006

OTHER PUBLICATIONS

INPI Search Report and Written Opinion for FR 1911549 dated Jul. 10, 2020 (9 pages).

*Primary Examiner* — Duy T Nguyen
(74) *Attorney, Agent, or Firm* — Crowe & Dunlevy

(57) ABSTRACT

Trenches of different depths in an integrated circuit are formed by a process utilizes a dry etch. A first stop layer is formed over first and second zones of the substrate. A second stop layer is formed over the first stop layer in only the second zone. A patterned mask defines the locations where the trenches are to be formed. The dry etch uses the mask to etch in the first zone, in a given time, through the first stop layer and then into the substrate down to a first depth to form a first trench. This etch also, at the same time, etch in the second zone through the second stop layer, and further through the first stop layer, and then into the substrate down to a second depth to form a second trench. The second depth is shallower than the first depth.

19 Claims, 7 Drawing Sheets

(51) Int. Cl.
*H01L 21/306* (2006.01)
*H01L 21/308* (2006.01)
*H01L 21/311* (2006.01)
*H01L 25/16* (2006.01)
*H01L 25/18* (2023.01)

(52) U.S. Cl.
CPC .. *H01L 21/30625* (2013.01); *H01L 21/31116* (2013.01); *H01L 25/16* (2013.01); *H01L 25/18* (2013.01)

(58) Field of Classification Search
CPC ... H01L 25/16; H01L 25/18; H01L 27/11541; H01L 21/76232; H01L 21/76229
USPC .......................................................... 438/691
See application file for complete search history.

(56) References Cited

U.S. PATENT DOCUMENTS

| | | | |
|---|---|---|---|
| 2007/0128804 A1 | 6/2007 | Jin et al. | |
| 2008/0038931 A1* | 2/2008 | Yeh | H01L 21/76205 438/740 |
| 2009/0121269 A1* | 5/2009 | Caillat | H01L 27/10823 257/E21.651 |
| 2010/0184295 A1* | 7/2010 | Sato | H01L 21/76229 438/702 |

* cited by examiner

PROCESS FOR FABRICATING AN INTEGRATED CIRCUIT COMPRISING A PHASE OF FORMING TRENCHES IN A SUBSTRATE AND CORRESPONDING INTEGRATED CIRCUIT

PRIORITY CLAIM

This application claims the priority benefit of French Application for Patent No. 1911549, filed on Oct. 16, 2019, the content of which is hereby incorporated by reference in its entirety to the maximum extent allowable by law.

TECHNICAL FIELD

Implementations and embodiments relate to integrated circuits and, in particular, to the formation of trenches in a semiconductor substrate.

BACKGROUND

Trenches are formed in the semiconductor substrate of an integrated circuit for a number of reasons.

For example, a trench-forming phase is typically employed in the fabrication of shallow trench isolations (STIs). Shallow trench isolations make it possible, for example, to electrically isolate transistors which may be incorporated within a logic portion or within a non-volatile memory region.

For obvious reasons of saving on fabrication costs, the shallow trench isolations located in the logic portion and in the non-volatile memory portion are produced simultaneously and have the same structure.

However, the logic portion typically comprises dopants implanted in large quantities, resulting in crystal defects which may lead to dislocations if mechanical stresses are high. The volume of dielectric in the shallow trench isolations may lead to such stresses, and to this end it would be desirable to decrease the volume of dielectric.

However, in the non-volatile memory portion, high voltages are present and may generate parasitic effects, and to this end it would be desirable to improve lateral isolation.

In other words, it would be desirable to fabricate shallower (i.e., first depth) shallow trench isolations in the logic portion and deeper (i.e., second depth greater than the first depth) shallow trench isolations in the non-volatile memory portion.

Of course, the need to fabricate shallow trench isolations of different depths is not limited to the example presented above of a logic portion and a non-volatile memory, and may apply to other portions and other types of integrated circuit device.

Specifically, according to another example, again given without limitation, a phase of forming trenches in the semiconductor substrate of an integrated circuit may also be employed in the fabrication of the vertical gates of buried vertical-gate transistors, or in the fabrication of vertical capacitive elements in the substrate.

Similarly, the trenches that are intended to accommodate vertical gates or electrodes of capacitive elements are formed simultaneously, or simultaneously together with the formation of shallow trench isolations.

Additionally, the depth of the trenches accommodating vertical gates has an effect on the performance of the buried transistors and on the other steps in the fabrication of the buried transistors, and it is therefore very difficult to modify an established depth. However, it would be advantageous for vertical capacitive elements to be able to use deeper trenches so as to increase the capacitive value per unit area of said capacitive elements.

In other words, it would also be desirable to fabricate shallow trench isolations for the electrodes of vertical capacitive elements that are deeper than the trenches for the vertical gates of buried transistors or the shallow trench isolations.

Dissociating the fabrication of trenches in the semiconductor substrate in the various portions of the substrate according to the purpose of the trench is not employed in industrial production processes for cost reasons (except possibly under exceptional circumstances for very specific requirements).

Conventional techniques propose removing a portion of the dielectric filling the shallow trench isolations in order to decrease the volume of dielectric and thus to relax the stresses due to the volume of dielectric. These techniques have the drawback of introducing parasitic effects, known as "hump" effects (i.e., in particular deformations in the characteristics of transistors), which are generally due to edge effects caused by the removal of a portion of the dielectric.

It would be desirable to be able to use trenches of various depths in the substrate less expensively and without parasitic effects.

SUMMARY

According to one aspect, what is proposed is a process for fabricating an integrated circuit including a semiconductor substrate having a first zone and a second zone, the process comprising a phase of forming trenches in the substrate. The trench-forming phase comprises: forming a first stop layer on top of a front face of the substrate in the first zone and in the second zone; forming a second stop layer on top of the first stop layer in the second zone; and performing a dry etch delimited by an etch mask in the first zone and in the second zone which is configured to etch, in a given time, in the first zone, the first stop layer, then at least one first trench into the substrate down to a first depth relative to the front face, and to etch, at the same time, in the second zone, the second stop layer, then the first stop layer, then at least one second trench into the substrate down to a second depth relative to the front face, the second depth being shallower than the first depth.

In other words, just one step of dry etching allows trenches of different depths to be formed in the first zone and in the second zone. The difference between the depths is obtained by giving time to the etching of the second stop layer in the second zone which is not given to the etching of the trench in the substrate, out of the total duration of the time given to the dry etch. Additionally, the formation of the second stop layer is not critical in terms of alignment or materials used, and the cost of use thereof is modest.

Advantageously, the process further comprises an operation of completely removing the second stop layer.

According to one implementation, the process further comprises, after the dry etch, performing a wet etch that is configured to laterally remove a portion of the first stop layer from the flanks etched by the dry etch, wherein the second stop layer is configured such that said wet etch results in said complete removal of the second stop layer.

In other words, what is proposed is the use of a wet etch which is already employed in an etching process for removing a lateral portion of the first stop layer, commonly known as "nitride pullback", in order to completely remove the second stop layer. The second layer is advantageously configured to react suitably with the wet etch as it was initially intended, i.e., so as to be completely removed.

According to one implementation, the first stop layer and the second stop layer comprise silicon nitride and the second stop layer comprises dopants at a concentration chosen such that said wet etch results in said complete removal of the second stop layer.

According to another implementation, the first stop layer comprises silicon nitride and the second stop layer comprises a material, different from the silicon nitride of the first stop layer, that is configured such that said wet etch results in said complete removal of the second stop layer.

In other words, the second stop layer is advantageously chosen in relation to the dry etch so as to introduce a certain difference in depth between the trenches in the first zone and in the second zone, as well as in relation to the wet etch so as to be completely removed in the step of removing a lateral portion from the flanks of the first stop layer ("nitride pullback" step). Doping silicon nitride allows the reactivity of the second stop layer to the wet etch to be parametrized, and thus the thickness of this layer and therefore also the difference between the depths to be parametrized.

According to one implementation, the process comprises an operation of overfilling the trenches with a dielectric material, and a chemical-mechanical polishing operation that is stopped by the first stop layer, the trenches thus filled being configured to form shallow trench isolations.

The process may advantageously comprise an operation of completely removing the second stop layer in order to simplify the detection of the first stop layer for stopping the chemical-mechanical polishing operation.

This latter implementation is very useful, but not essential, when the process further comprises steps of forming a non-volatile memory in the first zone of the substrate and steps of forming a logic portion in the second zone of the substrate.

According to another implementation, the process comprises an operation of forming a dielectric envelope on the flanks and at the bottom of the trenches, an operation of overfilling the trenches with a conductive material and a chemical-mechanical polishing operation that is stopped by the first stop layer, the trenches thus filled in the first zone being configured to form vertical electrodes of capacitive elements and the trenches thus filled in the second zone being configured to form vertical gates of buried transistors.

Similarly, the process may advantageously comprise an operation of completely removing the second stop layer in order to simplify the detection of the first stop layer for the chemical-mechanical polishing operation.

This latter implementation is very useful, but not essential, when the process further comprises steps of forming a capacitive element in the first zone of the substrate and steps of forming a non-volatile memory in the second zone of the substrate.

For example, the difference between the first depth and the second depth is between 10 nm and 100 nm.

According to another aspect, what is proposed is an integrated circuit including a semiconductor substrate having a front face, a first zone of the substrate including at least one first element formed in a first trench extending vertically into the substrate down to a first depth relative to the front face and a second zone of the substrate including at least one second element formed in a second trench extending vertically into the substrate down to a second depth relative to the front face, the second depth being shallower than the first depth.

Of course, "vertically" in this context means "in a direction perpendicular to the front face".

According to one embodiment, the integrated circuit includes a transition trench delimiting the first zone on one side of the transition trench and the second zone on the other side of the transition trench, the bottom of the transition trench being asymmetric relative to a median plane of the transition trench and located between said one side and said other side.

In other words, the bottom of the transition trench includes a low portion, on the side of the first zone, and a high portion, shallower than the low portion, on the side of the second zone. An inclined plane connects the low portion to the high portion at the bottom of the transition trench.

According to one embodiment, said at least one first element comprises a shallow trench isolation and said at least one second element comprises a shallow trench isolation.

This latter embodiment is very useful, but not essential, when the first zone includes a non-volatile memory and the second zone includes a logic portion.

Specifically, the non-volatile memory thus benefits from improved lateral isolation, which decreases parasitic effects from leakages, and the logic portion benefits from lower mechanical stresses, decreasing the risk of dislocation.

According to another embodiment, said at least one first element comprises a vertical gate of a buried transistor and said at least one second element comprises a vertical electrode of a capacitive element.

This latter embodiment is very useful, but not essential, when the first zone includes a capacitive element and the second zone includes a non-volatile memory.

Specifically, the vertical electrode may thus cover a larger area depthwise into the substrate, and the capacitive value per unit area of the capacitive element may thus be increased without being limited by an established depth for the trenches of the buried transistors.

BRIEF DESCRIPTION OF THE DRAWINGS

Other advantages and features of the invention will become apparent on examining the detailed description of completely non-limiting embodiments and implementations, and the appended drawings, in which.

DETAILED DESCRIPTION

Figure 1:
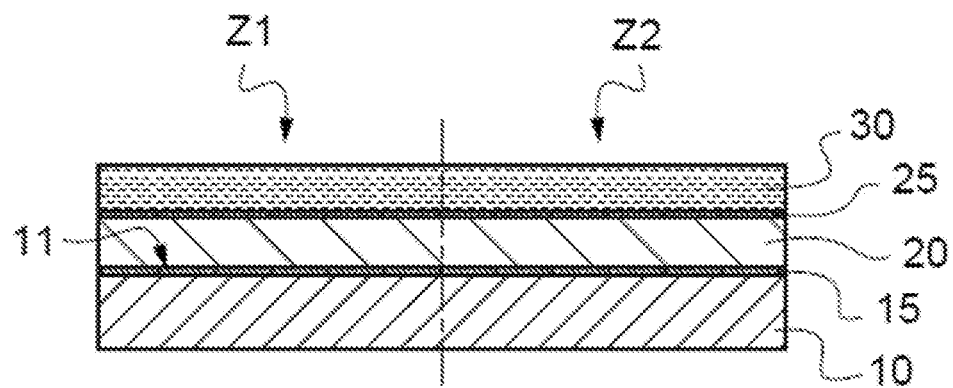
FIGS. 1-12 illustrate results of steps in implementations of a fabrication process.

FIG. 1 illustrates the result of a step in a phase of forming trenches in a semiconductor substrate 10 in a process for fabricating an integrated circuit.

The semiconductor substrate 10 is, for example, formed of silicon and comprises a first zone Z1 and a second zone Z2.

According to a first variant, the first zone Z1 may be intended to include a non-volatile memory region and the second zone Z2 may be intended to include a logic portion, for example both incorporated within a microcontroller.

According to a second variant, the first zone Z1 may be intended to include a capacitive element structured vertically in the substrate and the second zone Z2 may be intended to include a non-volatile memory, for example both incorporated within a microcontroller.

The capacitive element may have a vertical structure such as, for example, described in the French Application for Patent Nos. 1757907, 1757906 or 1902278 (the disclosure of which are incorporated by reference).

The substrate 10 includes a front face 11, which corresponds to the face of the substrate 10 on which electronic components, such as transistors or diodes, will be produced, in the portion also referred to as the "front end of line" (FEOL).

The front face 11 has been covered with a conventional buffer oxide layer 15. For example, the buffer oxide layer includes about 7 nm of silicon dioxide obtained by deposition or growth.

A first stop layer 20 has been formed on top of the buffer oxide layer 15 on the front face 11 of the substrate 10, in the first zone Z1 and in the second zone Z2.

For example, the first stop layer 20 is formed of silicon nitride, and is obtained by low-pressure chemical vapor deposition (LPCVD). The thickness of the first stop layer 20 may be about 80 nm.

A second stop layer 30 has been formed over the first stop layer 20, in the first zone Z1 and in the second zone Z2.

For example, the second stop layer 30 is formed of doped silicon nitride, and is obtained by plasma-enhanced chemical vapor deposition (PECVD). The doping may be carried out in situ during deposition or ex situ by later implantation. The thickness of the second stop layer 30 may be about 40 nm. Reference will be made to the description below relating to FIG. 12 for the evaluation of the thickness of the second stop layer 30.

Figure 12:
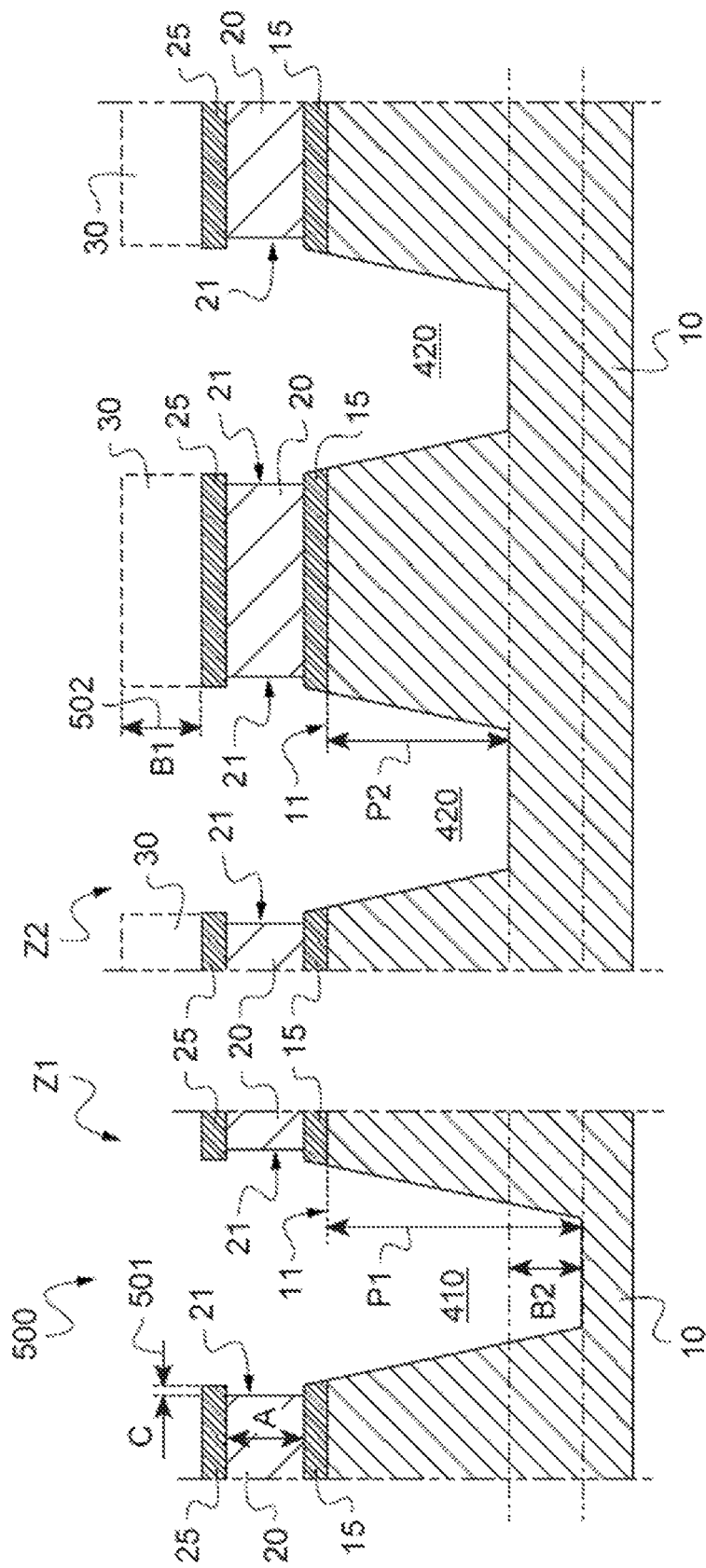

As an alternative, the second stop layer 30 may be of another nature and be the result of other formation techniques as long as, for example, the conditions described below with reference to FIG. 12 are met.

An inter-nitride oxide layer 25 has been formed between the first stop layer 20 and the second stop layer 30, and may comprise a thickness of around 5 nm of silicon dioxide.

Figure 2:
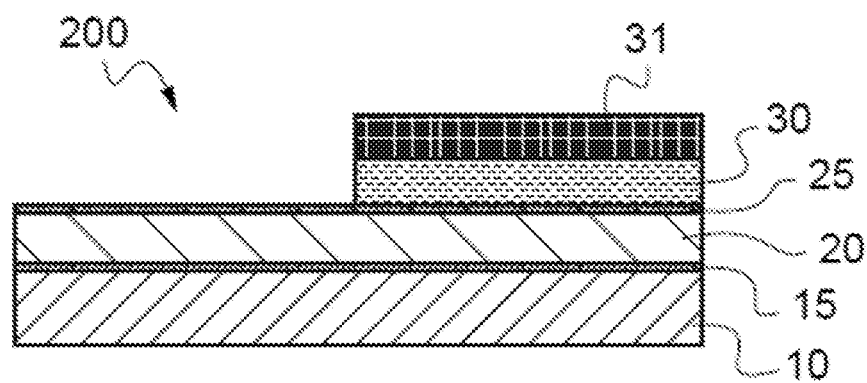

FIG. 2 shows the result of a step 200 of removing the second stop layer 30 from the first zone Z1 so that the second stop layer 30 is formed in the second zone Z2 only.

The removal operation 200 comprises an operation of forming a mask 31, which may be aligned roughly, and a selective etch for etching the second stop layer 30 without reacting with the inter-nitride oxide layer 25. Such a selective etch is typically implemented using a bath of phosphoric acid $H_3PO_4$.

Figure 3:
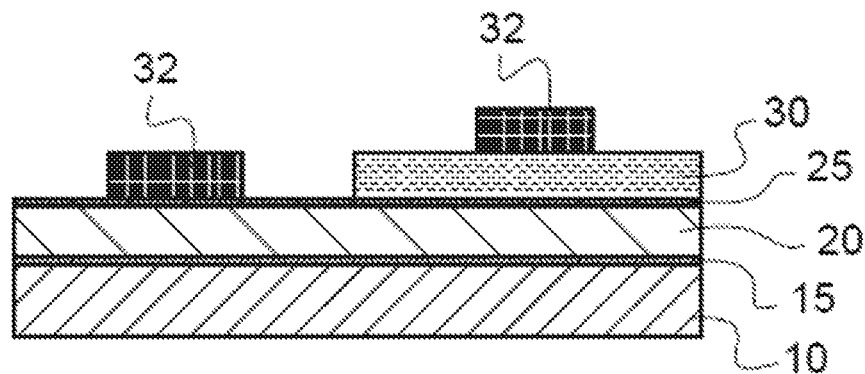

FIG. 3 shows the formation of an etch mask 32 which is lithographed to reveal the pattern of the future trenches in the areas of the first stop layer 20 in the first zone Z1 and of the second stop layer 30 in the second zone Z2.

Figure 4:
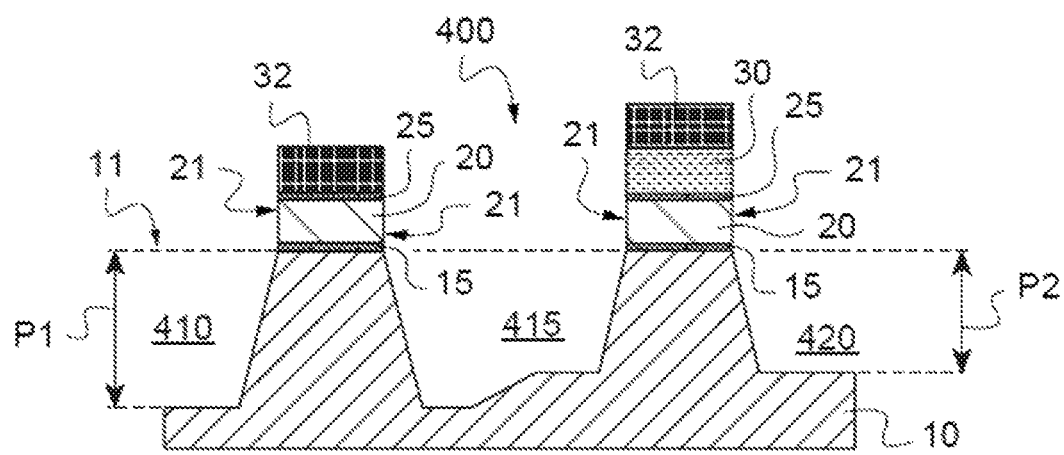

FIG. 4 shows the result after performing a dry etch 400 delimited by the etch mask 32.

The dry etch 400, for example using ion bombardment, is capable of etching the second stop layer 30, the inter-nitride oxide layer 25, the first stop layer 20, the buffer oxide layer 15 and the silicon of the substrate 10.

The dry etch 400 is applied to the structure described above with reference to FIG. 3 for a given amount of time so as to form trenches 410, 415 and 420 in the substrate 10, in the first zone Z1 and in the second zone Z2.

Thus, in the first zone Z1, the stop layer 20 is first etched in those portions which are not covered by the mask 32. Next, at least one first trench 410 is etched into the substrate 10 down to a first depth P1 relative to the front face 11.

At the same time, in the second zone Z2, the stack of the second stop layer 30 and of the first stop layer 20 which is not covered by the mask 32 is etched. Next, at least one second trench 420 is etched into the substrate 10 in the time remaining from said time given to the dry etch 400. The second trench 420 thus has a second depth P2 relative to the front face 11. Because of the time taken to remove the second stop layer 30, the substrate 20 has been exposed to the etch 400 for less time in zone Z2, and the second depth P2 is shallower than the first depth P1.

In this example, a trench 415, referred to as a transition trench, has been formed at the site of the transition between the first zone Z1 and the second zone Z2. Given that, at the site of said transition, one portion (on the right-hand side of the figure) of the opening in the etch mask 32 (FIG. 3) includes the stack of the first stop layer 20 and of the second stop layer 30 while the other portion of the opening (on the left-hand side of the figure) includes only the first stop layer, the bottom of the transition trench 415 will exhibit a variation in depth. The effect of the dry etch 400 on the substrate 10 will produce an inclined plane between the low portion and the high portion of the bottom of the transition trench, which will thereby be asymmetric relative to a median plane of the trench. The description of this asymmetry will be returned to below with reference to FIG. 11.

Figure 5:
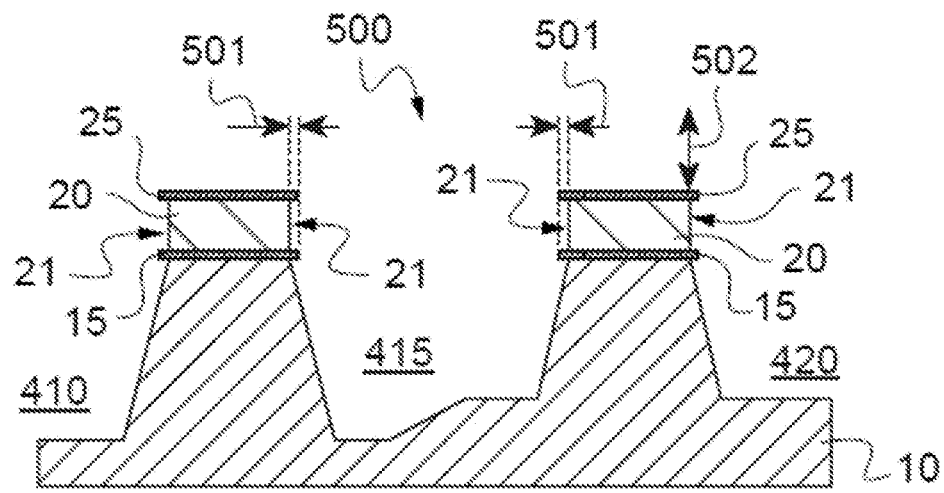

FIG. 5 shows the result of the performance of a wet etch 500 which is intended to laterally remove a portion 501 of the remnants of the first stop layer 20 and further to completely remove 502 the second stop layer 30.

The wet etch may be implemented using a bath of phosphoric acid $H_3PO_4$, as for example typically used to remove the lateral portions 501 of the first stop layer made of silicon nitride. This step is usually referred to by the term "nitride pullback".

Reference is now made to FIG. 12.

FIG. 12 shows the structure obtained in the process for forming the trenches at the same time as in FIG. 5, after the wet etch 500. The same elements bear the same reference signs and are not described in detail again here.

As mentioned above with reference to FIG. 5, the wet etch 500 uses a bath of phosphoric acid $H_3PO_4$ and is therefore selective with respect to the dissolution of silicon nitride and does not react (or at the very least reacts negligibly) with silicon oxide $SiO_2$ and the silicon of the substrate 10.

The first stop layer 20, made of silicon nitride, exhibits a given etch speed, or reactivity, with respect to phosphoric acid, the value ER20 of which is, for example, about 8 nm/min.

The wet etch 500 is configured to remove a width C laterally from the flanks 21 of the first stop layer 20, in the hole formed in the first stop layer 20 by the dry etch 400.

The second stop layer 30, made of doped silicon nitride or of another material, is configured to exhibit an etch speed, or reactivity, with respect to phosphoric acid, the value ER30 of which is, for example, about 40 nm/min.

It is assumed that the dry etch 400 is configured to etch the second stop layer 30, the first stop layer 20 and the silicon of the substrate 10 at the same speed such that the difference B2 between the first depth P1 and the second depth P2 is equal to the thickness B1 of the second stop layer 30. Of course, in practice, the abovementioned layers may be etched by the dry etch 400 at speeds that differ slightly from one another. Thus, the resulting difference in depth B2 between the depths P1 and P2 may differ from the thickness B1 of the second stop layer 30. In any case, a person skilled in the art will be able to calculate the difference in depth obtained using knowledge of the etch speeds of the chosen materials with respect to the dry etch 400 used in practice.

In summary, the wet etch 500 is intended and configured to remove a lateral portion 501 from the flanks 21 of the remnants of the first stop layer 20.

The second stop layer 30 is configured such that said wet etch 500 results in complete and total removal of the second stop layer 30. For example, the choice of dopant concentration in silicon nitride, or the choice of another material, may allow the second stop layer to be configured to this end.

Specifically, as will become apparent below with reference to FIG. 7, the first stop layer 20 must be exposed for the polishing step 700.

Thus, for cost reasons, it is preferable to design the second stop layer 30 for its reactivity with the wet etch 500 rather than to provide an additional etch for removing or completing the removal of the second stop layer 30.

The maximum thickness B1 of the second stop layer is therefore parametrized by the reactivity ER30 of the material of the second stop layer 30 with respect to phosphoric acid 500.

Lastly, this thickness B1 results in the difference in depth B2 between the first trenches 410 located in the first zone of the substrate 10 and the second trenches 420 located in the second zone of the substrate 10.

For example, in practice, if the "nitride pullback" wet etch is limited (by a given technology) to a lateral removal of 30 nm of thickness from the first stop layer 20, then, with k=ER30/ER20, the thickness B1 of the second stop layer 30 is limited to k*30 nm. The thickness B1=k*30 nm introduces a depth difference B2 according to the dry etch 400, for example B2=B1. Consequently, by choosing for example the doping of the silicon nitride of the second stop layer 30 so as to parametrize ratio k, it is possible to parametrize the value of the difference in depth B2 between the first trenches 410 and the second trenches 420.

The nature and concentration of dopants implanted into the silicon nitride may allow the ratio k to vary from 2 to 20.

Figure 6:
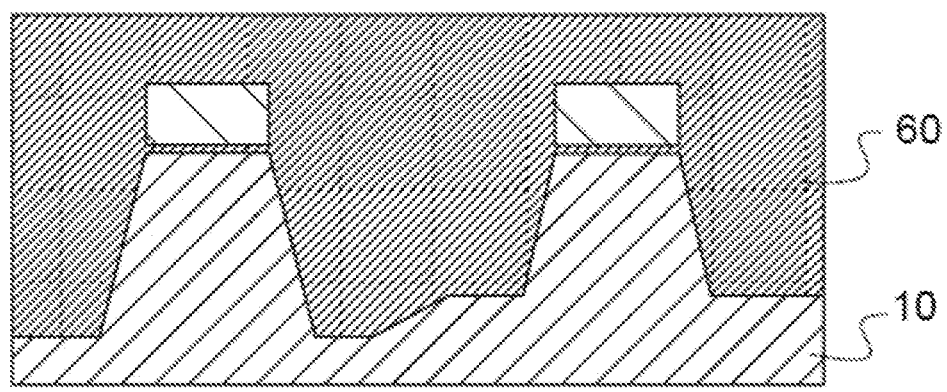

FIG. 6 shows the result of a step of overfilling the trenches 410, 415 and 420 with a trench material 60.

For example, in the first variant mentioned above with reference to FIG. 1, the trench material 60 may be a dielectric, for example silicon dioxide, so as to form shallow trench isolations (STIs).

For example, in the second variant mentioned above with reference to FIG. 1, the trench material 60 may be, as an alternative, a conductive material such as polycrystalline silicon so as to form vertical electrodes of capacitive elements in the first zone Z1 and vertical gates of buried transistors in the second zone Z2.

Figure 7:
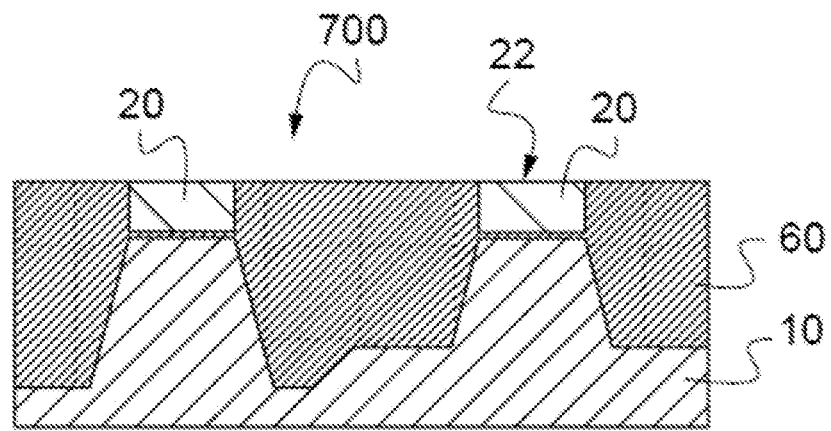

FIG. 7 illustrates the result of a step 700 of chemically-mechanically polishing the trench material 60, which is stopped once the surface 22 of the first stop layer 20 is reached.

Figure 8:
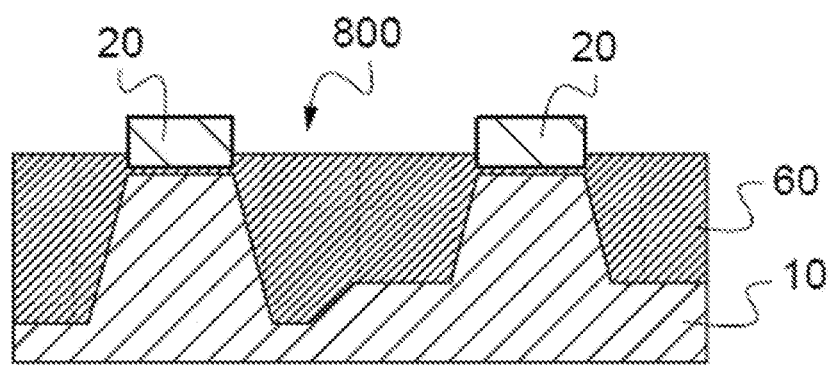

FIG. 8 shows the result of a typical step 800 of recessing the trench material 60, for example using a bath of hydrofluoric acid if the trench material 60 is silicon dioxide or using a dry etch if the trench material 60 is polycrystalline silicon.

Figure 9:
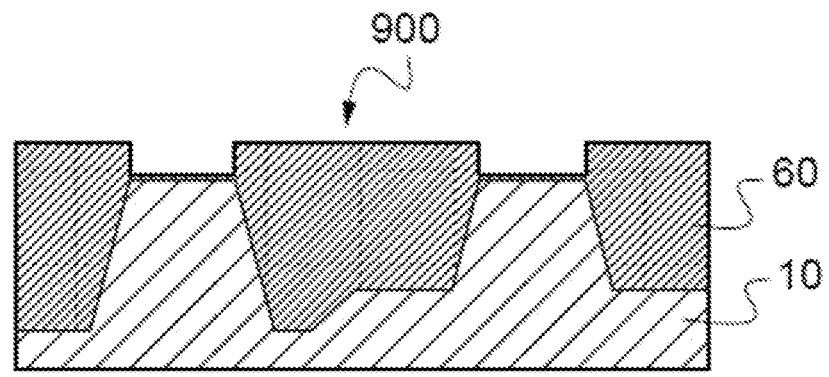

FIG. 9 shows the result of a typical step 900 of removing the first stop layer 20 using a selective wet etch such as a bath of phosphoric acid $H_3PO_4$.

Figure 10:
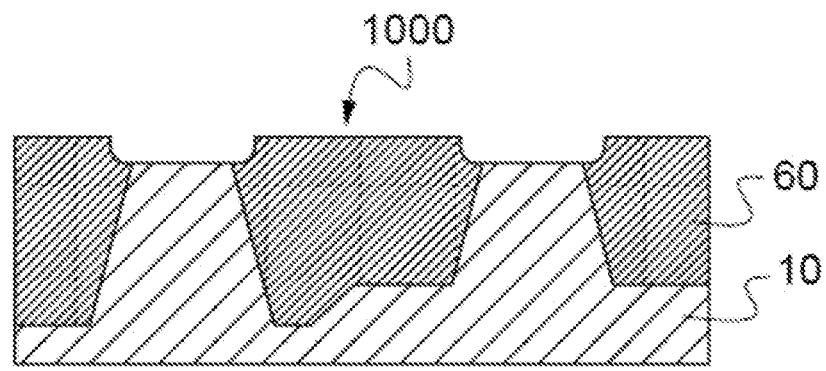

FIG. 10 shows the result of a typical wet etch 1000, in particular in order to remove the buffer oxide layer 15 from the front face 11 of the substrate 10.

Figure 11:
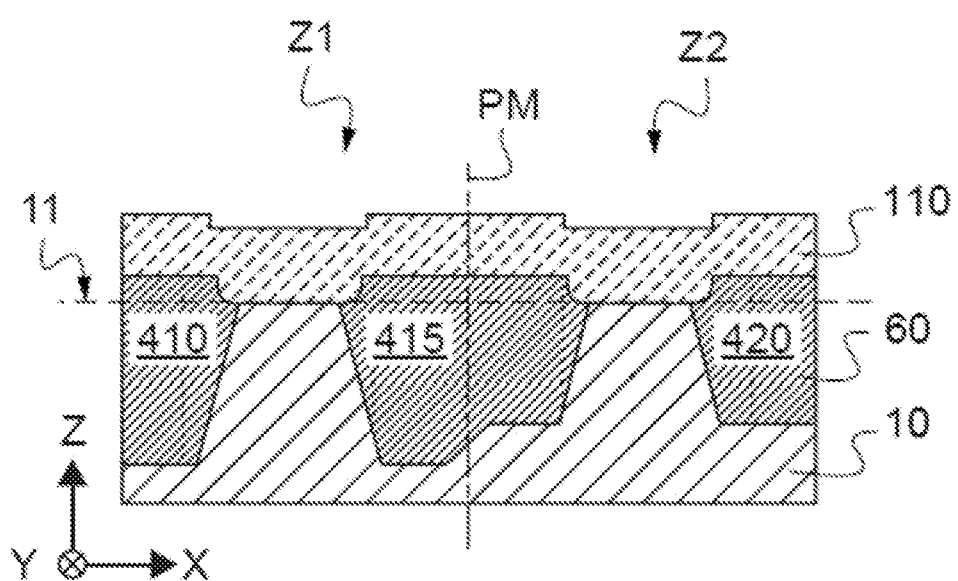

FIG. 11 schematically shows the result of forming a structure 110 on top of the front face 11 of the substrate 10 thus exposed. The structure may, for example, comprise transistors having gates, for example gates that are connected to one another by a polycrystalline silicon bar made from the structure 110.

It will be noted in the structure of FIG. 11 that is obtained upon completion of the process described above with reference to FIGS. 1 to 11 that a trench 415, referred to as a transition trench, has been formed between the first zone Z1 and the second zone Z2.

The transition trench 415 runs lengthwise in the direction Y and delimits widthwise the first zone Z1 on one side of the transition trench 415 in the direction X and the second zone Z2 on the other side in the direction X.

The process that has made it possible to obtain the structure has created, at the bottom of the transition trench 415, an asymmetry relative to a median plane PM in the directions Y and Z, in the middle of the width (X) of the transition trench 415. In other words, the median plane of the transition trench 415 is located between said one side (Z1) and said other side (Z2).

Where X, Y and Z are three orthogonal directions in space such that the front face 11 of the substrate 10 lies in a plane in the directions X and Y.

An integrated circuit may advantageously include the structure of FIG. 11 and comprise, in the first zone Z1, at least one first element formed in a first trench 410 extending into the substrate 10 in a direction perpendicular to the front face 11, down to a first depth P1 relative to the front face 11, and, in the second zone Z2, at least one second element formed in a second trench 420 extending into the substrate 10 in a direction perpendicular to the front face 11, down to a second depth P2 relative to the front face 11, the second depth P2 being shallower than the first depth P1.

The integrated circuit may thus comprise a non-volatile memory with good lateral isolation so that, for example, parasitic effects from leakages are decreased, and a logic portion that is subjected to little or no mechanical stress from the shallow trench isolations.

The integrated circuit may also comprise a vertical capacitive structure in the substrate exhibiting a high capacitive value per unit area, and in parallel, for example, buried vertical-gate transistors with characteristics that are independent of the depth of the capacitive structure.

Of course, the invention is not limited to these embodiments but encompasses all variants thereof, and may be applied to portions of an integrated circuit and types of integrated circuit device other than the logic portion, the non-volatile memory and the capacitive element mentioned above.

The invention claimed is:

1. A process for fabricating an integrated circuit, comprising:
    forming trenches in a semiconductor substrate having a first zone and a second zone, wherein forming trenches comprises:
    forming a first nitride stop layer over a front face of the semiconductor substrate in the first zone and in the second zone;
    forming a second nitride stop layer over the first nitride stop layer in the second zone;
    performing a dry etch delimited by an etch mask in the first zone and in the second zone, wherein performing said dry etch comprises:
    etching, in a given time, in the first zone, through the first nitride stop layer and into the semiconductor substrate down to a first depth relative to the front face to form a first trench; and
    etching, in said given time, in the second zone, through the second nitride stop layer, through the first nitride stop layer and into the semiconductor substrate down to a second depth relative to the front face to form a second trench;
wherein the second depth is shallower than the first depth;
performing a wet etch that laterally removes a portion of the first nitride stop layer from flanks that are etched by performing the dry etch, wherein performing said wet etch completely removes the second nitride stop layer;
wherein the first nitride stop layer and the second nitride stop layer comprise silicon nitride and the second nitride stop layer comprises dopants at a concentration chosen such that performing said wet etch results in said complete removal of the second nitride stop layer.

2. The process according to claim 1, further comprising:
overfilling the first trench and the second trench with a dielectric material; and
performing a chemical-mechanical polishing operation that is stopped by the first nitride stop layer;
wherein the dielectric material in the first trench and the second trench form shallow trench isolations.

3. The process according to claim 2, further comprising:
forming a non-volatile memory in the first zone of the semiconductor substrate; and
forming a logic portion in the second zone of the semiconductor substrate.

4. The process according to claim 1, further comprising:
forming a dielectric envelope on flanks and a bottom of the first trench and the second trench;
overfilling the first trench and the second trench with a conductive material; and
performing a chemical-mechanical polishing operation that is stopped by the first nitride stop layer;
wherein the first trench thus filled in the first zone forms a vertical electrode of a capacitive element; and
wherein the second trench thus filled in the second zone forms a vertical gate of a buried transistor.

5. The process according to claim 1, further comprising:
forming a capacitive element in the first zone of the semiconductor substrate; and
forming a non-volatile memory in the second zone of the semiconductor substrate.

6. The process according to claim 1, wherein a difference between the first depth and the second depth is between 10 nm and 100 nm.

7. A process for fabricating an integrated circuit, comprising:
depositing a first nitride stop layer over a front face of the semiconductor substrate in the first zone and in the second zone;
depositing a second nitride stop layer over the first nitride stop layer in the second zone, wherein said second nitride stop layer is doped;
dry etching in the first zone, through the first nitride stop layer and into the semiconductor substrate down to a first depth relative to the front face to form a first trench;
dry etching in the second zone, through the second nitride stop layer, through the first nitride stop layer and into the semiconductor substrate down to a second depth relative to the front face to form a second trench;
wherein dry etching the first and second zone is performed for a same time period;
wherein the second depth is shallower than the first depth; and
performing a wet etch to completely remove the second nitride stop layer without completely removing the first nitride stop layer.

8. The process of claim 7, wherein dry etching the first and second zones is performed simultaneously.

9. The process of claim 7, wherein performing the wet etch laterally removes a portion of the first nitride stop.

10. The process of claim 7, further comprising filling the first trench and the second trench with a dielectric material to form shallow trench isolations.

11. The process of claim 10, further comprising:
forming a non-volatile memory in the first zone of the semiconductor substrate; and
forming a logic portion in the second zone of the semiconductor substrate.

12. The process of claim 7, further comprising:
forming a dielectric envelope on flanks and a bottom of the first trench and the second trench;
filling the first trench and the second trench with a conductive material;
wherein the conductive material in the first trench forms a vertical electrode of a capacitive element; and
wherein the conductive material in the second trench forms a vertical gate of a buried transistor.

13. The process of claim 7, wherein a difference between the first depth and the second depth is between 10 nm and 100 nm.

14. A process for fabricating an integrated circuit, comprising:
forming trenches in a semiconductor substrate having a first zone and a second zone, wherein forming trenches comprises:
forming a first stop layer over a front face of the semiconductor substrate in the first zone and in the second zone;
forming a second stop layer over the first stop layer in the second zone; and
performing a dry etch delimited by an etch mask in the first zone and in the second zone, wherein performing said dry etch comprises:
etching, in a given time, in the first zone, through the first stop layer and into the semiconductor substrate down to a first depth relative to the front face to form a first trench; and
etching, in said given time, in the second zone, through the second stop layer, through the first stop layer and into the semiconductor substrate down to a second depth relative to the front face to form a second trench;
wherein the second depth is shallower than the first depth;
forming a dielectric envelope on flanks and a bottom of the first trench and the second trench;
overfilling the first trench and the second trench with a conductive material; and
performing a chemical-mechanical polishing operation that is stopped by the first stop layer;
wherein the first trench thus filled in the first zone forms a vertical electrode of a capacitive element; and
wherein the second trench thus filled in the second zone forms a vertical gate of a buried transistor.

15. The process according to claim 14, further comprising completely removing the second stop layer.

16. The process according to claim 14, further comprising, after performing the dry etch, performing a wet etch that laterally removes a portion of the first stop layer from flanks that are etched by performing the dry etch, wherein performing said wet etch completely removes the second stop layer.

17. The process according to claim 16, wherein the first stop layer comprises silicon nitride and the second stop layer comprises a material, different from the silicon nitride of the first stop layer, that is configured such that performing said wet etch results in said complete removal of the second stop layer.

18. The process according to claim 14, wherein the first stop layer and the second stop layer comprise silicon nitride and the second stop layer comprises dopants.

19. The process according to claim 14, wherein a difference between the first depth and the second depth is between 10 nm and 100 nm.

* * * * *